United States Patent
Jang et al.

(10) Patent No.: US 6,798,799 B2
(45) Date of Patent: Sep. 28, 2004

(54) WAVELENGTH LOCKED INTEGRATED OPTICAL SOURCE STRUCTURE USING MULTIPLE MICROCAVITY

(75) Inventors: Dong-Hoon Jang, Suwon-shi (KR); Dong-Soo Bang, Suwon-shi (KR); Jung-Kee Lee, Taejonkwangyok-shi (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 167 days.

(21) Appl. No.: 10/095,419

(22) Filed: Mar. 11, 2002

(65) Prior Publication Data

US 2002/0196821 A1 Dec. 26, 2002

(51) Int. Cl.[7] .................................................. H01S 3/04
(52) U.S. Cl. ............................. 372/34; 372/32; 372/50; 372/92; 372/98
(58) Field of Search .......................... 359/247; 372/20, 372/19, 105, 99, 92, 34, 32, 98, 50, 107

(56) References Cited

U.S. PATENT DOCUMENTS

| | | | | |
|---|---|---|---|---|
| 5,299,212 A | | 3/1994 | Koch et al. ................... 372/32 |
| 5,798,859 A | * | 8/1998 | Colbourne et al. ......... 359/247 |
| 6,108,355 A | * | 8/2000 | Zorabedian ................... 372/20 |
| 6,600,760 B1 | * | 7/2003 | Green et al. ................... 372/20 |
| 2002/0172239 A1 | * | 11/2002 | McDonald et al. ........... 372/20 |

* cited by examiner

Primary Examiner—Leon Scott, Jr.
(74) Attorney, Agent, or Firm—Cha & Reiter, L.L.C.

(57) ABSTRACT

A wavelength-locked, integrated optical signal source structure using a semiconductor laser device is disclosed. The optical source structure has a semiconductor laser formed on a semiconductor substrate, and an etched portion coupled with an output end of the semiconductor laser. The etched portion is configured to pass on a first amount of light beam radiated by the semiconductor laser, and to reflect a second amount of light beam by a given reflection angle. A multiple microcavity is formed in a position spaced apart from the etched portion, and the first amount of light beam is incident upon the multiple microcavity. The optical source structure has a first optical detector for detecting the first amount of light beam passing through the multiple microcavity, and a second optical detector for detecting the second amount of light beam reflected by a slanted, reflecting surface portion of the etched portion. The relative change in the light intensity in the first and second optical detectors is measured out to maintain a constant optical wavelength.

9 Claims, 9 Drawing Sheets

WAVELENGTH LOCKED INTEGRATED OPTICAL SOURCE STRUCTURE USING MULTIPLE MICROCAVITY

CLAIM OF PRIORITY

The present application makes reference to and claims all benefits accruing under 35 U.S.C. §119 from an application entitled, "Wavelength Locked Integrated Optical Source Structure Using Multiple Microcavity," filed earlier in the Korean Industrial Property Office on Jun. 23, 2001 and thereby duly assigned Ser. No. 35999/2001.

BACKGROUND OF THE INVENTION

1. Field of the Invention

The present invention relates to a wavelength-locked, optical-signal source used in wavelength-division-multiplexing (WDM) system applications and, more particularly, to a temperature-independent wavelength-locked module using a multiple microcavity (MMC) structure.

2. Description of the Related Art

A demand for more speed and bandwidth in Internet applications has grown exponentially. As such, optical communication systems are a fast-growing constituent of communication networks. The expression "optical communication system," as used herein, relates to any system that uses optical signals to convey information across an optical waveguide medium. Such optical systems include, but are not limited to, telecommunications systems, cable television systems, and local area networks (LANs). While the need for communication services increases, the current capacity of existing waveguide media is limited. Although capacity may be expanded, i.e., by laying more fiber optic cables, the cost of such expansion is not economical. Accordingly, there exists a need for a cost-effective way to increase the capacity of existing optical waveguides.

Currently, the maximum transfer rate of optical signals has reached 10 Gbps or 40 Gbps, which substantially seems to be a technical limit applicable to the current state of the art. To overcome this problem, a wavelength-division-multiplexing (WDM) system has been widely used in the art, being capable of simultaneously transferring a multiplicity of carrier wavelengths in a single optical fiber. As a number of carrier wavelengths used in the WDM optical communication system increases, however, a more precise control of operating wavelengths is required to keep constant the space gap between those wavelengths to avoid cross-talk between optical channels. To this end, a distributed feedback semiconductor laser is used mainly as an optical source for many optical communication systems with a wavelength (i.e., about 0.1 nm/deg) which increases together with an increase in temperature. Some drawbacks in this type of laser are that its wavelength fluctuates as its internal components become degraded by aging and external environment changes. Therefore, there exists a need in the WDM optical communication system to maintain a constant wavelength through a successive measurement of the carrier wavelength and a suitable electrical control therefor.

A known prior art wavelength-locking technique uses etalon filters, dispersive gratings, fiber Gragg gratings, etc., in which the change in wavelength is detected by an optical detector, and the minute changes in wavelength are measured to keep a constant wavelength while taking into account an ambient temperature, a current amount, etc. Recent development in this field has proposed an improved method of measuring the changes in the light intensity of optical signals in optical channels according to the wavelengths by integrating a multi-mode interferometer (MMI) into optical components, but it is noted that the method still has a disadvantage in that the amount of such changes in the light intensity of optical signals according to the change in the wavelengths may be too small to be utilized for actual applications.

Referring now to FIGS. 1 and 2, a prior-art mechanism for measuring the wavelength changes using the etalon filter will be described briefly in the following figures. These figures show that the length of an optical channel in an etalon filter 14 changes depending upon the degrees of an incident angle of a laser beam incident on the etalon filter 14 from an optical source, i.e., a distributed feedback semiconductor laser 10 through a prism 12. Here, it is noted that the light intensity of wavelengths in a first optical detector M1 and a second optical detector M2 measured with respect to multiple wavelengths is subject to some degree of fluctuation, as seen in FIG. 2 of waveforms. The wavelength locking is carried out by using the measured values by these first and second optical detectors. Also, in such a system of using the characteristic of etalon filters, an incident light beam may be split into two beams, i.e., a first light beam measured by the first optical detector M1, and a second light beam passing through the etalon filter measured by the second optical detector M2, prior to measuring a change in the light intensity of the optical signal detected in comparison to a reference light beam.

As the above prior art wavelength-locking technique has mainly utilized distributed-feedback semiconductor laser diodes, etalon filters, and/or diffractive gratings for a dispersion of light beam, and its wavelength change could be determined by using the asymmetric property of dispersed light beam measured by multiple optical detectors, i.e., the aforementioned first and second optical detectors M1 and M2 (preferably, using a twin photodiode), many of specialized devices and components need to be integrated into one package. This requirement for an integrated package of an optical signal source inevitably results in considerable difficulty in its manufacturing process. As a result, this kind of high-precision, optical-alignment technique generally has a relatively low yield and a high-production cost owing to such difficulty in the manufacturing process, and has led to one of the obstacles to its wider use in the state of the art. Thus, an external type of a wavelength locker has been more generally used to date for implementation of the WDM optical communication systems.

Another known system used for keeping a constant optical wavelength is disclosed in the U.S. Pat. No. 5,299,212 entitled, "Article Comprising A Wavelength-Stabilized Semiconductor Laser," to Koch et al., in which the wavelength of a tunable laser source is controlled using a fiber grating as a wavelength reference. In this system using a two-section distributed-Bragg-Reflector (DBR) laser diode, a launched laser beam is split into two beams by a beam splitter, one of which beams is directly measured by an optical detector and the other of which beams is subsequently applied to a fiber grating. Therefore, the comparison of the intensity of those two optical light beams in both of the optical detectors enables measuring the change in an operating carrier wavelength, by utilizing the typical physical property of a fiber optic cable with decreasing permeability relative to a particular wavelength. With such a measured wavelength, a feedback control current is fed to the Bragg section of a multi-segment DBR laser diode such that the wavelength of the laser is a function of the feedback control current, thereby regulating to maintain a constant wavelength.

While the above-known technique may be useful for controlling the wavelength of the optical signal source, the patent has some limitation in a range of wavelengths capable of regulation in accordance with the characteristic of the fiber grating, and its peak point of wavelength may drift away to some extent owing to the changes in the environment of the fiber gratings, although it could be somewhat regulated by control factors such as a grating period or reflectance. Furthermore, a relatively large number of constituent elements such as two beam splitters, optical fiber gratings, etc., has given birth to the technical difficulty in integration into a single optical module. Therefore, the above technique has been mainly used with providing the optical communication system with the length-control capability, irrespective of the DBR laser diode. In conclusion, the above-described construction of the prior art optical signal source inevitably involves the minute adjustment of wavelength depending upon the physical characteristics of gratings and/or beam splitters, which may be inconvenient and inefficient in the stable operation of the optical communication system, and it additionally requires a relatively large number of control devices, for example, including two or more optical detectors, as described above.

SUMMARY OF THE INVENTION

The present invention relates to a wavelength-locked, integrated optical signal source with a semiconductor laser capable of measuring the minute change in wavelength using a multiple microcavity.

The present invention is directed to the structure of a wavelength-locked, integrated optical signal source enabling a simplified manufacturing process by integrating a temperature-independent multiple microcavity into a semiconductor laser.

According to one aspect of the present invention, the wavelength-locked, integrated optical signal source includes a semiconductor laser portion formed on a semiconductor substrate; an etched portion coupled with an output end of the semiconductor laser portion, having a slanted, reflecting surface portion, the etched portion configured to pass on a first amount of light beam radiated by the semiconductor laser portion, and to reflect a second amount of light beam other than the first amount of light beam, by a given reflection angle; a multiple microcavity formed in a position spaced apart from the etched portion, the first amount of light beam being incident upon the multiple microcavity; a first optical detector coupled with one end of the multiple microcavity for detecting the first amount of light beam passing through the multiple microcavity; and, a second optical detector coupled with one end of the etched portion for detecting the second amount of light beam reflected by the slanted, reflecting surface portion of the etched portion, wherein the relative change in the light intensity in the first and second optical detectors is measured out to maintain a constant optical wavelength.

Preferably, the multiple microcavity can be configured so that the amount of intensity change of light beam according to the optical wavelength is adjustable by changing a number of layers in the multiple microcavity. The formation of constituent elements may be carried out in either monolithic or hybrid integration.

According to another aspect of the present invention, the wavelength-locked, integrated-optical-signal-source structure includes a semiconductor laser portion formed on a semiconductor substrate; an etched portion coupled with an output end of the semiconductor laser portion, having a slanted, reflecting surface portion, the etched portion configured to pass on a first amount of light beam launched by the semiconductor laser portion, and to reflect a second amount of light beam other than the first amount of light beam, at a given reflection angle; a first optical detector coupled with the slanted, reflecting surface portion of the etched portion, for detecting the first amount of light beam passing through the slanted, reflecting surface portion; a multiple microcavity coupled with the etched portion, the second amount of light beam reflected by the slanted, reflecting surface portion being incident upon the multiple microcavity; and, a second optical detector coupled with one end of the multiple microcavity, for detecting the second amount of light beam passing through the multiple microcavity, wherein the relative change in the light intensity in the first and second optical detectors is measured to maintain a constant optical wavelength.

According to a further aspect of the present invention, the wavelength-locked, integrated-optical-signal-source structure includes a semiconductor laser portion formed on a semiconductor substrate; an etched portion coupled with one end of the semiconductor laser portion, having a reflecting surface portion, the etched portion configured to pass on a first amount of light beam launched by the semiconductor laser portion, and to reflect a second amount of light beam other than the first amount of light beam, by a predetermined reflection angle; a multiple microcavity formed in a position spaced apart from the etched portion, the first amount of light beam passing through the etched portion being incident upon the multiple microcavity and a predetermined range of wavelength being reflected by the multiple microcavity; a first optical detector coupled with one end of the etched portion, for detecting the first amount of light beam reflected by the reflecting surface portion; and, a second optical detector coupled with an adjacent end of the etched portion, in a position opposed to the first optical detector, for detecting the second amount of light beam reflected by multiple microcavity of the etched portion, wherein the relative change in the light intensity in the first and second optical detectors is measured out to maintain a constant optical wavelength.

BRIEF DESCRIPTION OF THE DRAWING

The foregoing and other features and advantages of the invention will be apparent from the following more detailed description of preferred embodiments as illustrated in the accompanying drawings, wherein the same reference characters refer to the same parts or components throughout the various views. The drawings are not necessarily to scale, but the emphasis is placed instead upon illustrating the principles of the invention, wherein.

DETAILED DESCRIPTION OF THE PREFERRED EMBODIMENTS

In the following description, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments, which depart from these specific details. For the purpose of simplicity and clarity, detailed descriptions of well-known devices and methods are preferably omitted so as not to obscure the description of the present invention with unnecessary detail.

Figure 1:
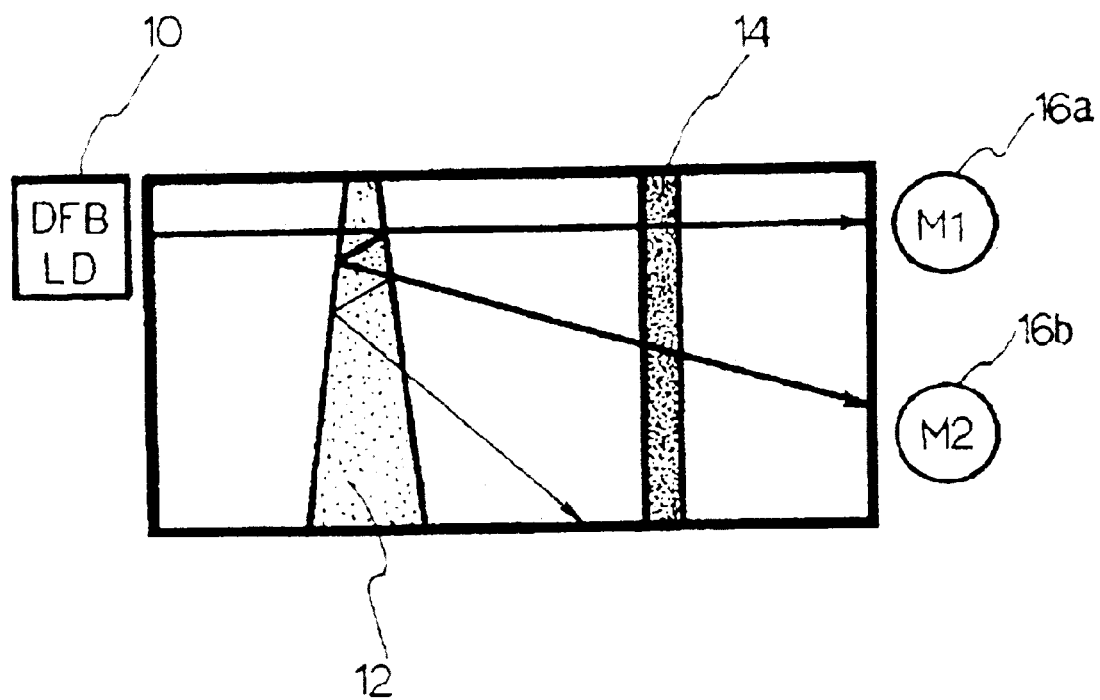
FIG. 1 illustrates a schematic view of the structure of a prior art wavelength-locked, optical signal source using an etalon filter.
Figure 2:
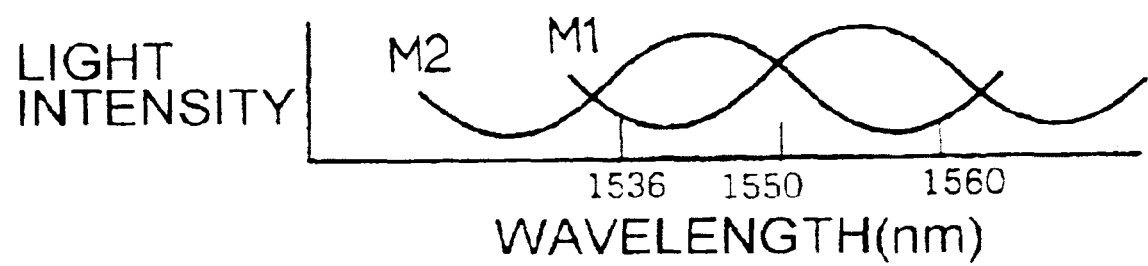
FIG. 2 illustrates a graphic diagram indicating the changes in light-detection intensity to the wavelength, accruing from the change of an optical channel length according to the changes in incident angles of a light beam to the etalon filter in the prior art wavelength-locked, optical signal source.
Figure 3:
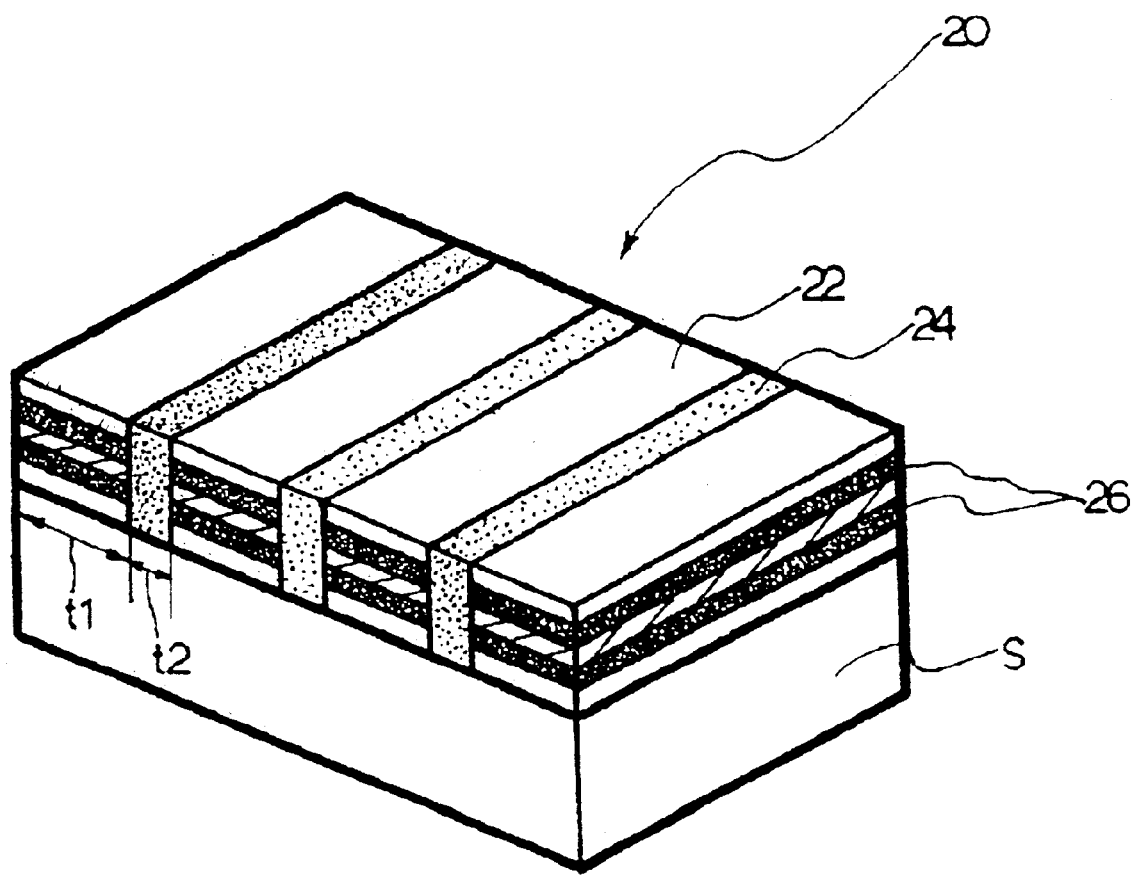
FIG. 3 illustrates a schematic diagram of the configuration of a multiple microcavity applicable to the present invention.

FIG. 3 illustrates the configuration of a multiple microcavity 20 capable of functioning as a wavelength-locked, integrated optical signal source in accordance with the techniques of the present invention. As shown in FIG. 3, the multiple microcavity 20 includes one or more substances of different refractive indices spaced apart by a predetermined amount, semiconductor regions 22 formed on the substrate, and polyimide regions 24 each formed between the semiconductor regions 22. The polyimide regions 24 may be replaced by air or other suitable substances with similar property. The structure of active layers 26 of the inventive multiple microcavity 20 is substantially similar to that of known semiconductor lasers.

Figure 4:
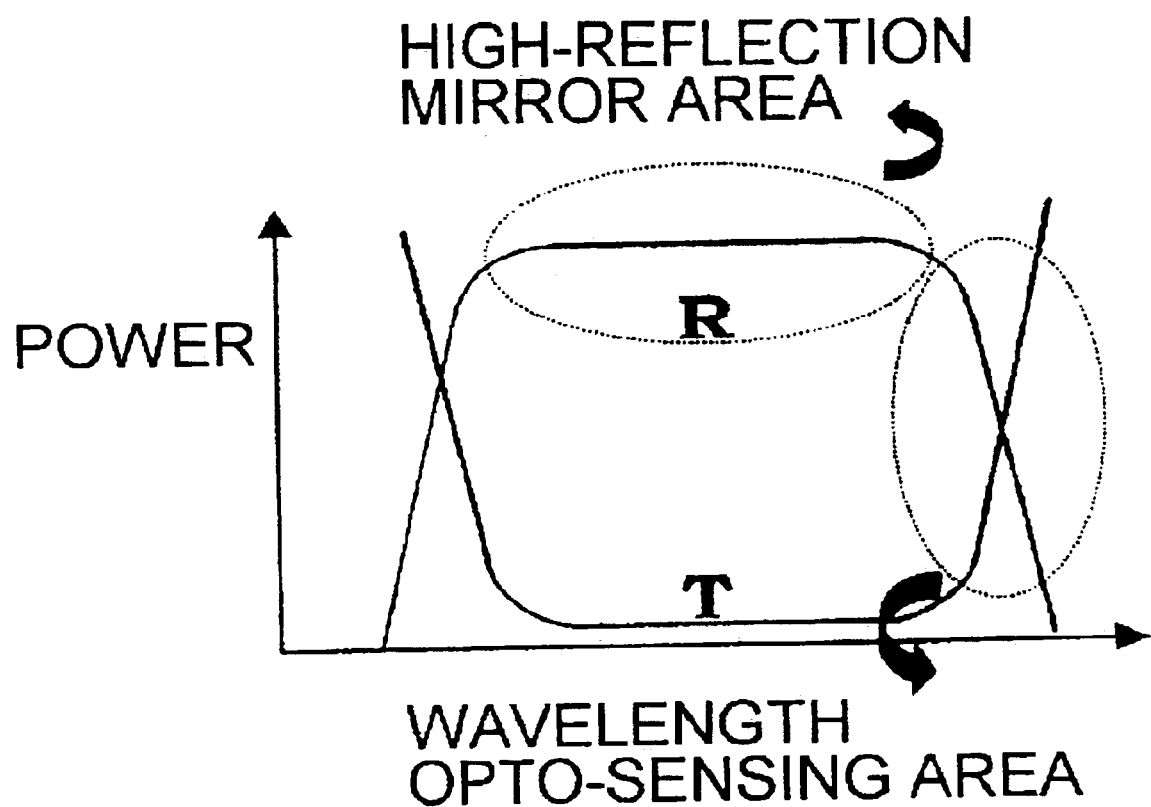
FIG. 4 illustrates a graphic diagram for explaining the operational characteristic to the wavelength of the multiple microcavity structure applicable to the present invention.

Referring to FIG. 4, the general operational characteristics, i.e., the changes of permeability and reflectance to a wide range of wavelengths of the multiple microcavity structure applicable to the present invention will be described. When the semiconductor regions 22 and the polyimide regions 24 are repeatedly formed on the semiconductor substrate (S) as shown in FIG. 3, an incident light beam is reflected in a majority of wavelengths, but a sharp change of permeating light intensity is affected in a particular area of the wavelength. Hence, the intended multiple microcavity 20 corresponding to the wavelength in use can be prepared by suitable regulation of a layer width $t_1$ of the semiconductor region 22 and a layer width $t_2$ of the polyimide region 24.

Figure 5:
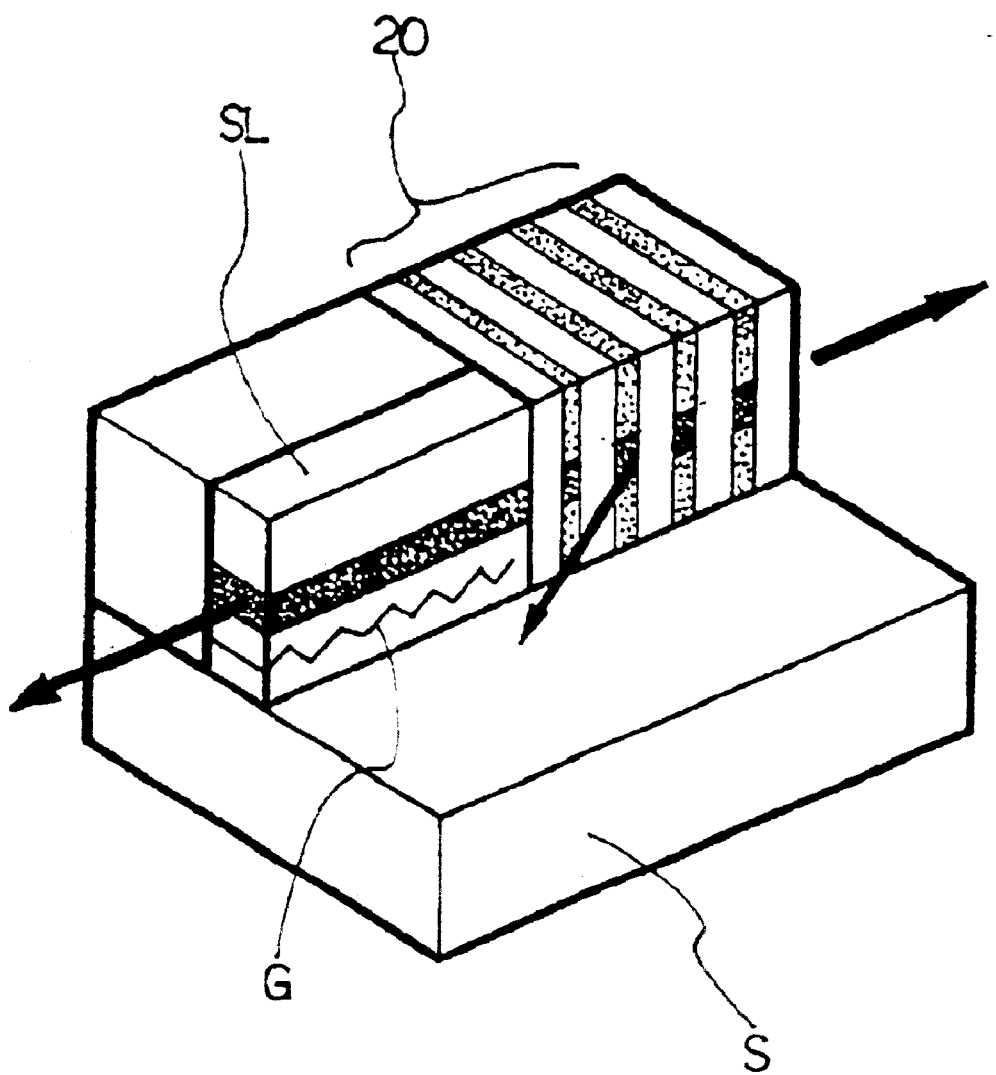
FIG. 5 illustrates a schematic diagram of the configuration of an integrated semiconductor laser using the multiple microcavity applicable to the present invention.

FIG. 5 illustrates a schematic diagram of the configuration of a distributed feedback semiconductor laser (SL) integrating thereto the multiple microcavity 20 according to the embodiment of the present invention. A diffraction grating (G) is provided to ensure that the semiconductor laser operates at a constant wavelength, in which part of the output light is allowed to exit through the multiple microcavity 20.

Figure 6:
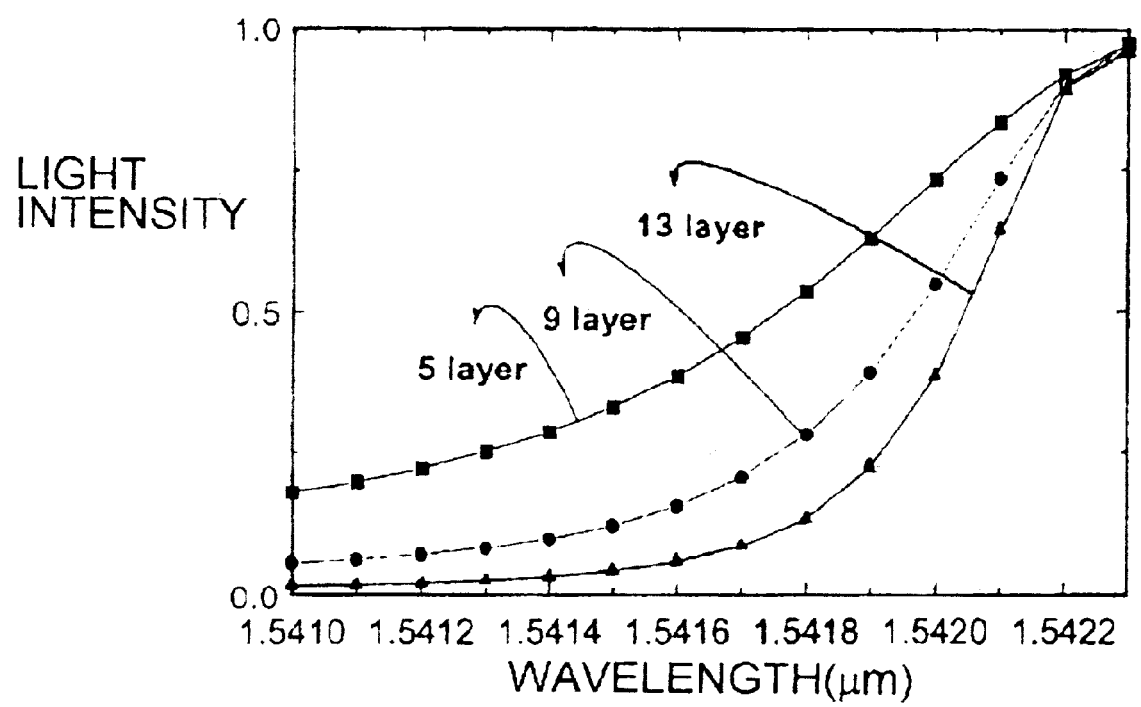
FIG. 6 illustrates a graphic diagram indicating the characteristic of light permeability to the wavelength of the integrated semiconductor laser using the multiple microcavity applicable to the present invention.

FIG. 6 illustrates the characteristics of the intensity of light permeability to the wavelength of the integrated semiconductor laser using the multiple microcavity according to the present invention. The data shown in FIG. 6 is obtained by setting the layer width $t_1$ of the semiconductor region 22 to 4 m and the layer width $t_2$ of the polyimide region 24 to 1 m. As seen in the graph, it is appreciated that the intensity of the light beam permeating the multiple microcavity sharply decreases in proportion to the change of wavelengths. The operational characteristic of the multiple microcavity generally does not change with the change in temperature; meanwhile, the light intensity passing through the multiple microcavity does change sharply or sensitively if any minute change occurs in the operating wavelength of the distributed feedback semiconductor laser (SL). Inversely, such change in the light intensity can be measured by an optical detector to detect or determine the amount of the minute change of the wavelength in the distributed feedback semiconductor laser. Accordingly, the amount of the change in permeating light intensity according to the wavelength can be effectively controlled by properly decreasing or increasing the number of layers formed in the multiple microcavity. The present invention utilizes this principle in manufacturing the wavelength-locked, optical signal source with an integrated multiple microcavity, as shown in the preferred embodiments of FIGS. 7 to 9.

Figure 7:
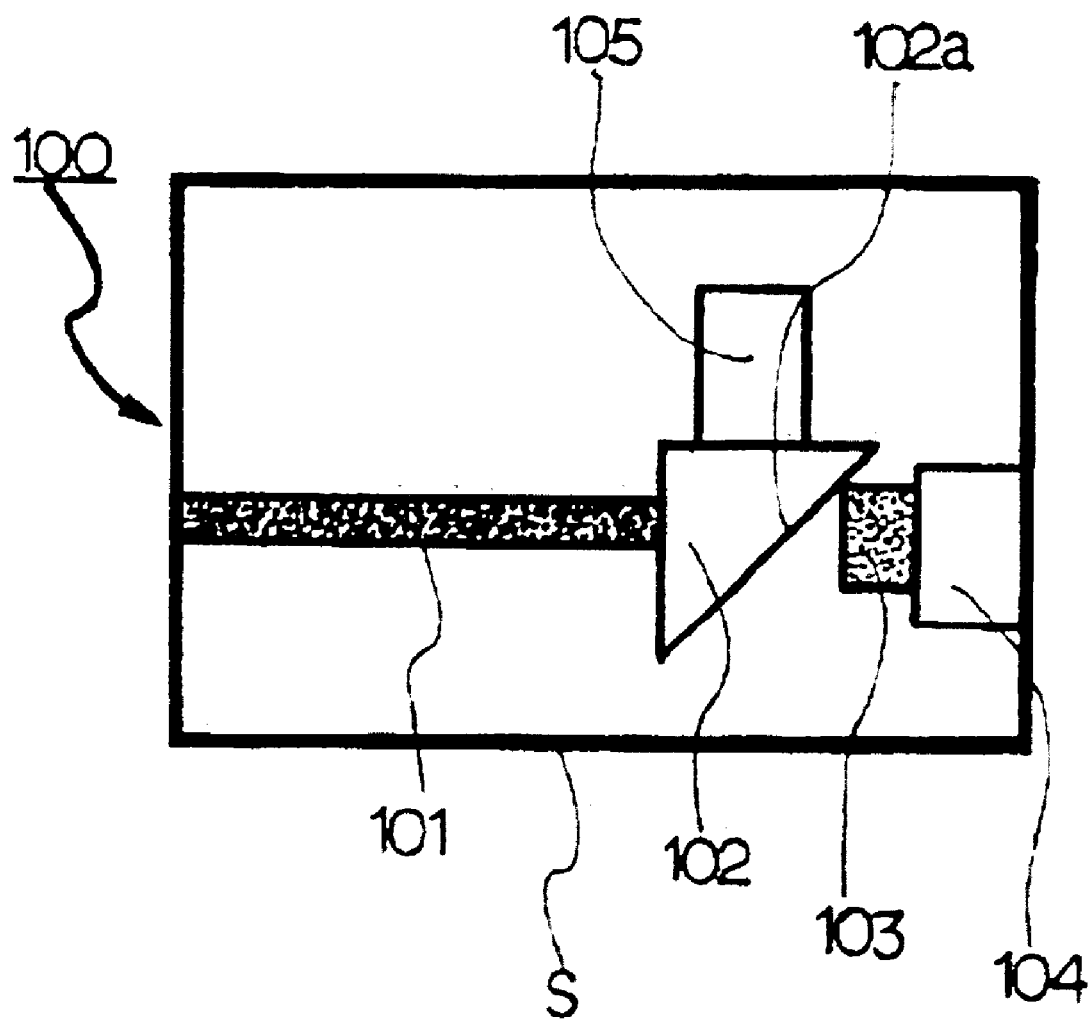
FIG. 7 illustrates a schematic diagram of a wavelength-locked, integrated optical signal source using the multiple microcavity according to a preferred embodiment of the present invention.

FIG. 7 illustrates the structure of the wavelength-locked, optical signal source 100 with the multiple microcavity according to a first preferred embodiment of the present invention. The optical source 100 has a semiconductor laser 101 for generation of a laser light beam, and a temperature-independent multiple microcavity 103 that is integrated into the semiconductor laser 101. The light intensity of the light beam incident upon the multiple microcavity 103 can be measured by an optical detector 104, while the amount of the minute change in optical wavelength launched from the semiconductor laser 101 can be measured by another optical detector 105. The wavelength locked, optical signal source 100 may include a control circuit (not shown) for receiving and processing the measured light intensity (or in terms of the amount of change). Note that the wavelength-locked, integrated optical signal source 100 may be implemented in monolithic or hybrid integration with the semiconductor laser 101 of the multiple microcavity 103.

For the above-mentioned characteristics, it is be essential for the semiconductor laser 101 to be suitably integrated with the multiple microcavity 103 to serve as an optical filter. As the rate changes in the refractivity of the semiconductor and the polyimide to temperature are normally contrary to each other, the selection of suitable polyimide material will offset any unilateral changes in the resultant refractivity, so that the wavelength-locked, integrated optical signal source 100 can be implemented with the temperature-independent, multiple microcavity 103 to function as an optical wavelength filter.

Referring back to FIG. 7, the structure of the wavelength-locked, integrated optical signal source 100 with the multiple microcavity 103 according to a first preferred embodiment of the present invention includes the semiconductor laser 101 formed on the semiconductor substrate (S). An etched portion 102 is configured to pass on a first light beam generated by the semiconductor laser 101, while reflecting a portion of the light beam (or a second light beam) through the slanted, surface portion 102a. The multiple microcavity 103 is provided to receive the portion of the first light beam passing through the etched portion 102. A first optical detector 104 is formed at one end of the multiple microcavity 103 in order to detect the received light beam, while a second optical detector 105 is formed to one end of the etched portion 102 in order to detect the reflected light beam. The etched portion 102 is formed by etching one end surface of the distributed feedback semiconductor laser 101. The light beam passing through the etched portion via the multiple microcavity 103 is measured by the first optical detector 104, whereas the deflected light beam via the slanted, surface portion 102a is measured by the second optical detector 105, which is disposed vertically to the slanted, surface portion 102a. As such, the measurement is subsequently made on the relative changes of the light intensity of the reflected light beam of a laser beam launched from the end surface of the distributed feedback semiconductor laser 101 and the light intensity of the laser beam passing through the multiple microcavity 103. Note that as the wavelength of the laser 101 is depended on the operating temperature, the wavelength control can be achieved by adjusting the internal temperature of the chip. Accordingly, by adjusting the temperature of the laser 101 using a temperature control chip (not shown) based on the wavelength drift measured by the respective detector 104 and 105, the wavelength of the optical signal source can be kept constant at a desired wavelength.

Preferably, the first and second optical detectors 104 and 105 may be formed by photodiodes that can be integrated into the semiconductor substrate.

Figure 8:
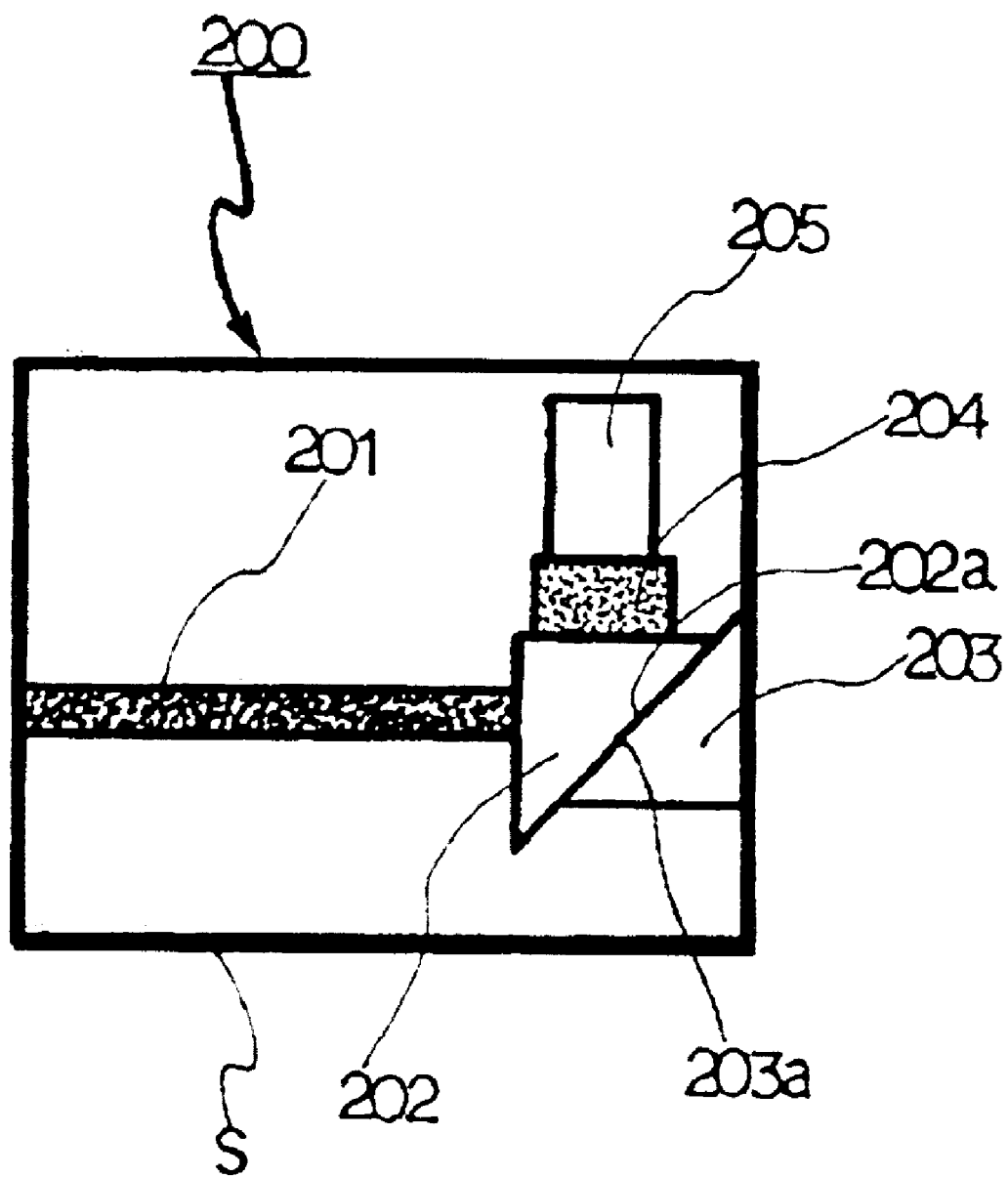
FIG. 8 illustrates a schematic diagram of a wavelength-locked, integrated optical signal source using the multiple microcavity according to another preferred embodiment of the present invention; and, FIG. 9 illustrates a schematic diagram of a wavelength-locked, integrated optical signal source using the multiple microcavity according to yet another preferred embodiment of the present invention.

FIG. 8 illustrates the structure of the wavelength-locked, integrated optical signal source 200 using the multiple microcavity 204 according to a second preferred embodiment of the present invention. The optical source 200 includes a semiconductor laser 201 for generation of a laser light beam, and a temperature-independent multiple microcavity 204, which is formed in integration into the semiconductor laser 201. More specifically, the structure of the wavelength-locked, integrated optical signal source 200 includes the semiconductor laser portion 201 formed on the semiconductor substrate S. An etched portion 202 is configured to pass on a first light beam launched by the semiconductor laser 201, but to reflect a second light beam, other than the first light beam, by a slanted, surface portion 202a. The multiple microcavity 204, upon which the second light beam is incident, is formed in integration into one end of the etched portion 102. A first optical detector 203 is formed in integration with one end of the slanted, surface portion 202a in order to detect the first light beam, while a second optical detector 205 is formed in integration with one end of the multiple microcavity 204 in order to detect the second light beam passing through the multiple microcavity 204. Therefore, similar to the first embodiment, a constant optical wavelength can be maintained by measuring the relative changes in the light intensity detectable in the first and second optical detectors. Preferably, the first and second optical detectors 203 and 205 may be formed by photodiodes that can be integrated into the semiconductor substrate. Preferably, the structure of the optical signal source 200 may be implemented in monolithic integration or hybrid integration with the semiconductor laser portion 201 of the multiple microcavity 204. Preferably, the surface 203a of the first optical detector 203 opposite to the slanted surface 202a of the etched portion 202 is formed with the similar slanted surface so as to minimize any influence upon operation of the optical source owing to back reflection of the second amount of light beam.

Figure 9:
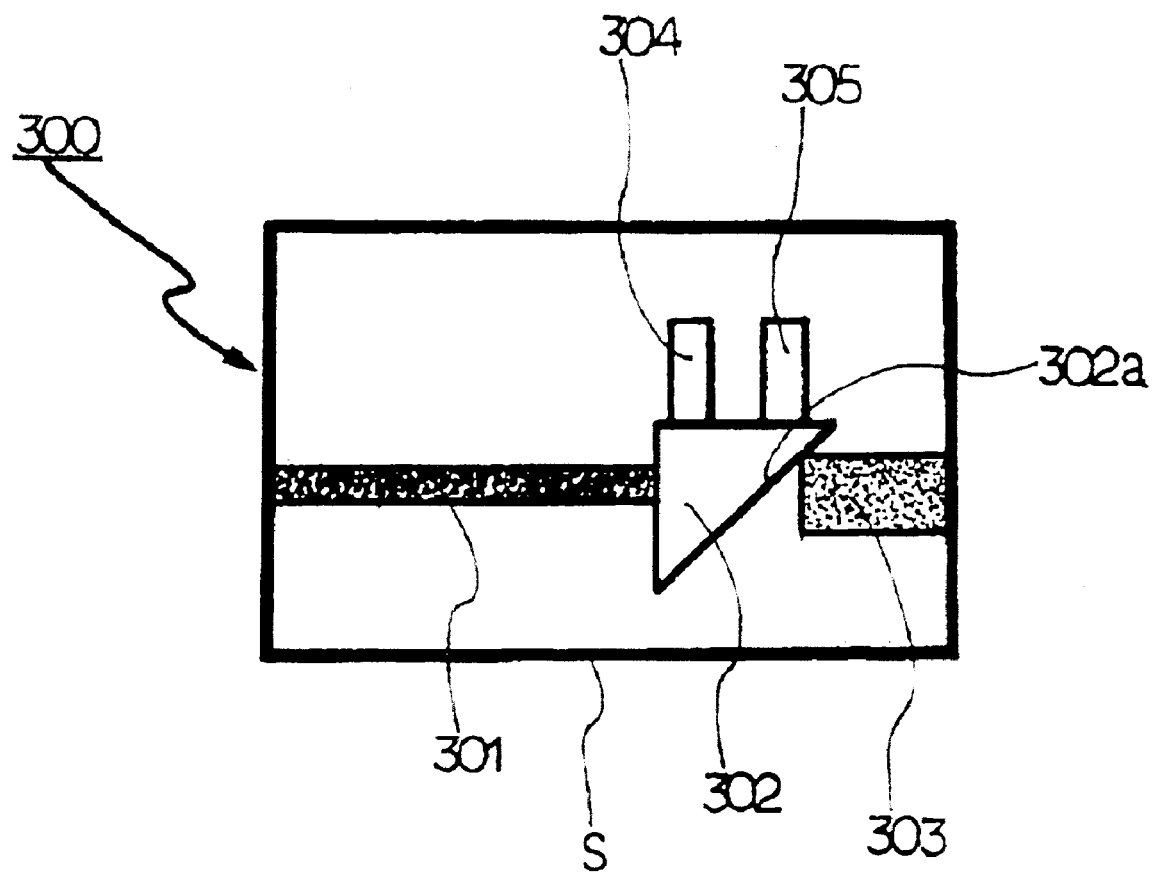

Referring now to FIG. 9, the structure of the wavelength-locked, integrated optical signal source 300 using the multiple microcavity according to a third preferred embodiment of the present invention has a distributed feedback semiconductor laser portion 301 formed on the semiconductor substrate S, for generation of a laser light beam, and a temperature-independent multiple microcavity 303. More specifically, an etched portion 302 is configured to pass on a first light beam launched by the semiconductor laser, but to reflect a second light beam, other than the first light beam, by a slanted, reflecting surface portion 302a. The multiple microcavity 303, upon which the first light beam passing through the slanted, reflecting surface portion 302a is incident while reflecting a given range of optical wavelengths, is formed in an adjacent position slightly spaced from the etched portion 302 in integration into the semiconductor substrate. A first optical detector 304 is formed in integration with one end of the slanted, surface portion 302 in order to detect the first light beam reflected by the slanted, reflecting surface portion 302a. A second optical detector 305 is formed in integration with the other end of the slanted, surface portion 302 in order to detect the second light beam reflected by the multiple microcavity 303 via the slanted, reflecting surface portion 302a. The second optical detector 305 is disposed in a symmetrical form to the first optical detector 304, spaced apart therefrom, on the dismal end of the slanted, surface portion 302. Therefore, similar to the above two embodiments, the constant optical wavelength can be maintained by measuring the relative changes in the light intensity detectable in the first and second optical detectors 304 and 305. Preferably, the first and second optical detectors 304 and 305 may be formed by photodiodes that can be integrated into the same semiconductor substrate. Preferably, the structure of the optical signal source 300 may be implemented in monolithic or hybrid integration with the semiconductor laser portion 301 and the multiple microcavity 303.

In summary, according to the preferred embodiments of the present invention, a laser light beam launched from the semiconductor laser device is split with a given separation ratio, a first split amount of which light beam is directly measured by a first optical detector and a second split amount of which light beam subsequently passes through an optical filter using an integrated multiple microcavity or is reflected by a reflecting means so that the light intensity of its light beam according to an operating wavelength can be measured by a second optical detector. Then, the amount of relative change in light intensity measured in the two optical detectors is determined by a control means, so that on the basis of the amount of the relative change in light beam intensity, a temperature regulator coupled with the optical signal source takes control of the operating temperature. Therefore, a minute fluctuation in wavelengths can be measured and compensated accordingly using a temperature control scheme, thereby keeping the wavelength of the optical signal source constant during operation. As a result, the wavelength-locked, integrated optical signal source using a multiple microcavity according to the present invention can be manufactured by integrating the multiple microcavity into a semiconductor substrate in monolithic or hybrid integration and using an active layer of a semiconductor laser portion as an optical detector, thereby simplifying its manufacturing process significantly. Therefore, such an integration of the temperature-independent wavelength-locked, integrated optical signal source into a semiconductor substrate using a multiple microcavity enables effectively and precisely measuring the minute change of the light intensity between the light intensity directly measured in the optical detector and the light intensity measured using the multiple microcavity. As apparent from the foregoing description, the integrated optical signal source of the present invention achieves the simplification of its structure and the temperature tolerance in operation.

While the preferred embodiments of the present invention have been illustrated and described, it will be understood by those skilled in the art that various changes and modifications may be made, and equivalents may be substituted for elements thereof without departing from the true scope of the present invention. For example, a Y-branch waveguide may be introduced to distribute the intensity of a laser beam with a given constant ratio, in which only an optical detector is integrated into one branch waveguide and then a multiple microcavity and another optical detector are integrated into the other branch waveguide as another embodiment of the present invention. Therefore, it is intended that the present invention not be limited to the particular embodiment disclosed as the best mode contemplated for carrying out the present invention; instead, it is intended that the present invention include all embodiments falling within the scope of the appended claims.

What is claimed:

1. An integrated optical signal source comprising:
a semiconductor laser having an etched portion with an output end that is configured with a slanted, reflecting surface for receiving an incident light beam radiated by said semiconductor laser, for partially passing the incident light beam as a first light beam, and for partially reflecting the incident light beam as a second light beam;
a multiple microcavity arranged apart from said etched portion and so that the first light beam is incident upon said multiple microcavity;
a first optical detector disposed to detect said first light beam after said first light beam has passed through said multiple microcavity;
a second optical detector arranged at said output end of said etched portion for detecting the second light beam reflected by said slanted, reflecting surface; and
a temperature controller in communicative connection with the first and second optical detectors for adjusting, based on a difference in respective light intensities of the first and second light beams, a temperature of said semiconductor laser in maintaining a constant optical wavelength.

2. The source of claim 1, further comprising a semiconductor substrate upon which to form said semiconductor laser.

3. The source of claim 2, wherein said source is configured with said multiple microcavity formed on said substrate.

4. An integrated optical signal source, comprising:
a semiconductor laser having an etched portion with an output end that is configured with a slanted, reflecting surface for receiving an incident light beam radiated by said semiconductor laser, for partially passing the incident light beam as a first light beam, and for partially reflecting the incident light beam as a second light beam;
a first optical detector disposed to detect said first light beam after said first light beam has passed through said slanted, reflecting surface;
a multiple microcavity arranged so that said second light beam is incident upon said multiple microcavity;
a second optical detector disposed for detecting said second light beam after said second light beam has passed through said multiple microcavity; and
a temperature controller in communicative connection with the first and second optical detectors for adjusting, based on a difference in respective light intensities of the first and second light beams, a temperature of said semiconductor laser in maintaining a constant optical wavelength.

5. An integrated optical signal source comprising:
a semiconductor laser having an etched portion with an output end that is configured with a slanted, reflecting surface for receiving an incident light beam radiated by said semiconductor laser, for partially passing the incident light beam as a first light beam, and for partially reflecting the incident light beam as a second light beam;
a multiple microcavity arranged apart from the etched portion and so that the first light beam passing through said etched portion is incident upon said multiple microcavity, a predetermined range of wavelength being reflected by said multiple microcavity;
a first optical detector, coupled to said etched portion and disposed for detecting said second light beam after reflection by said slanted, reflecting surface; and
a second optical detector coupled to said etched portion, in a position adjacent to said first optical detector and disposed for detecting said first light beam after reflection by the multiple microcavity and then by said slanted, reflecting surface; and
a temperature controller in communicative connection with the first and second optical detectors for adjusting, based on a difference in respective light intensities of the first and second light beams, a temperature of said semiconductor laser in maintaining a constant optical wavelength.

6. A method for providing a stabilized optical signal source, the method comprising the steps of:
providing a semiconductor laser having an etched portion with an output end that is configured with a slanted, reflecting surface for receiving an incident light beam radiated by said semiconductor laser, for partially passing the incident light beam as a first light beam, and for partially reflecting the incident light beam as a second light beam;
providing a multiple microcavity arranged apart from said etched portion and so that the first light beam is incident upon said multiple microcavity;
providing a first optical detector disposed to detect said first light beam after said first light beam has passed through said multiple microcavity;
providing a second optical detector arranged at said output end of said etched portion for detecting the second light beam reflected by said slanted, reflecting surface; and
providing a temperature controller in communicative connection with the first and second optical detectors for adjusting, based on a difference in respective light intensities of the first and second light beams, a temperature of said semiconductor laser in maintaining a constant optical wavelength.

7. The method of claim 6, wherein said multiple microcavity providing step comprises the steps of:
configuring said multiple microcavity with a number of layers; and
changing the number of layers in said multiple microcavity to adjust a rate of change of an intensity of said first light beam with optical wavelength.

8. The method of claim 6, wherein the providing steps for the semiconductor laser and the multiple microcavity include the step of forming said semiconductor laser and said multiple microcavity on a semiconductor substrate using monolithic integration.

9. The method of claim 6, wherein the providing steps for the semiconductor laser and the multiple microcavity include the step of forming said semiconductor laser and said multiple microcavity on a semiconductor substrate using hybrid integration.

* * * * *